United States Patent
Zanati et al.

(10) Patent No.: US 12,451,579 B2
(45) Date of Patent: Oct. 21, 2025

(54) INTERPOSERS WITH MILLIMETER-WAVE TRANSITIONS

(71) Applicant: NXP B.V., Eindhoven (NL)

(72) Inventors: Abdellatif Zanati, Hamburg (DE);
Jonas Ove Harm, Hamburg (DE);
Adrianus Buijsman, Nijmegen (NL)

(73) Assignee: NXP B.V., Eindhoven (NL)

( * ) Notice: Subject to any disclaimer, the term of this patent is extended or adjusted under 35 U.S.C. 154(b) by 364 days.

(21) Appl. No.: 18/149,026

(22) Filed: Dec. 30, 2022

(65) Prior Publication Data

US 2024/0222296 A1  Jul. 4, 2024

(51) Int. Cl.

| | |
|---|---|
| H01P 5/103 | (2006.01) |
| H01L 21/48 | (2006.01) |
| H01L 23/13 | (2006.01) |
| H01L 23/498 | (2006.01) |
| H01L 23/66 | (2006.01) |
| H01P 3/12 | (2006.01) |
| H01P 5/107 | (2006.01) |
| H01Q 1/50 | (2006.01) |
| H05K 1/02 | (2006.01) |
| H01L 23/00 | (2006.01) |
| H05K 1/18 | (2006.01) |

(52) U.S. Cl.
CPC .......... *H01P 5/103* (2013.01); *H01L 21/4853* (2013.01); *H01L 23/13* (2013.01); *H01L 23/49838* (2013.01); *H01L 23/66* (2013.01); *H01P 3/121* (2013.01); *H01P 5/107* (2013.01); *H01Q 1/50* (2013.01); *H05K 1/0243* (2013.01); *H01L 24/16* (2013.01); *H01L 2223/6633* (2013.01); *H01L 2224/16227* (2013.01); *H05K 1/181* (2013.01); *H05K 2201/09072* (2013.01); *H05K 2201/09985* (2020.08); *H05K 2201/10378* (2013.01)

(58) Field of Classification Search
CPC .................................. H01P 5/107; H01P 5/103
USPC ........................................................... 333/26
See application file for complete search history.

(56) References Cited

U.S. PATENT DOCUMENTS

| | | | |
|---|---|---|---|
| 8,536,954 B2 * | 9/2013 | Leiba et al. ........... | H05K 1/025 333/33 |
| 11,011,816 B2 | 5/2021 | Shi | |
| 11,196,146 B2 | 12/2021 | Moallem et al. | |
| 11,196,171 B2 | 12/2021 | Doyle et al. | |

(Continued)

FOREIGN PATENT DOCUMENTS

JP      2008252207 A      10/2008

OTHER PUBLICATIONS

Mika-Matti, Laurila et al; "Combination of E-J et and Inkjet Printing for Additive Fabrication of Multilayer High-Density RDL of Silicon Interposwer"; IEEE Trans. On Electron Devices, IEEE, USA, vol. 64, No. 3; pp. 1217-1224; (Mar. 1, 2017).

*Primary Examiner* — Benny T Lee

(57) ABSTRACT

A compact integrated circuit (IC) that outputs millimeter-wave energy can be assembled into a highly compact package that can utilize ultrasmall contacts and/or contacts arrange with nonstandard pitch. The millimeter-wave IC can be assembled onto an interposer that includes an integrated transition configured to be coupled to a millimeter-wave waveguide on a printed circuit board having contacts that have a standardized size and pitch.

16 Claims, 6 Drawing Sheets

(56) References Cited

U.S. PATENT DOCUMENTS

| | | |
|---|---|---|
| 2016/0064792 A1* | 3/2016 | Qiang et al. ......... H05K 1/0274 |
| | | 342/175 |
| 2017/0271761 A1 | 9/2017 | Purden et al. |
| 2018/0108968 A1 | 4/2018 | Purden et al. |
| 2020/0287290 A1 | 9/2020 | Yao et al. |
| 2021/0036393 A1 | 2/2021 | Mangaiahgari |
| 2021/0382135 A1 | 12/2021 | Hess et al. |
| 2022/0231423 A1 | 7/2022 | Park et al. |
| 2022/0407205 A1 | 12/2022 | Kamgaing et al. |

* cited by examiner

INTERPOSERS WITH MILLIMETER-WAVE TRANSITIONS

FIELD OF THE INVENTION

Embodiments of the subject matter described herein relate to structures and devices for coupling millimeter-wave signals generated by electronic device to external antenna structures.

BACKGROUND OF THE INVENTION

Miniaturized integrated circuits for millimeter-wave communications and other applications often must be coupled to antenna structures to function as intended. In some applications, a launcher configured to couple millimeter-wave radiation is integrated in a device package along with one or more millimeter-wave integrated circuits. In other applications, millimeter-wave integrated circuits are coupled to printed circuit boards that are provided with integrated millimeter-wave launchers that are designed to couple to millimeter-wave antenna structures.

SUMMARY OF THE INVENTION

In an example embodiment, a device (an interposer) includes a top surface having a first set of contact pads configured to be coupled to contact pads of an integrated circuit ("IC"); a bottom surface having a second set of contact pads configured to be coupled to a circuit board; a waveguide structure; and a transition structure. The waveguide structure is formed integrally within the interposer between the top surface and the bottom surface of the interposer. The transition structure is configured to couple millimeter-wave energy received via one or more of the contact pads on the top surface into the waveguide structure and to direct millimeter-wave energy received at the top surface of the interposer to propagate away from the top surface of the interposer through the waveguide structure and toward the bottom surface of the interposer.

In another example embodiment, a system includes an integrated circuit (IC) disposed within an IC package and an interposer circuit board ("interposer"). The interposer includes a transition structure configured to couple millimeter-wave energy received from the integrated circuit via a first set of contact pads on a top surface of the interposer into a waveguide structure integrally formed within a volume of the interposer between the top surface of the interposer and a bottom surface of the interposer; and the transition structure is configured to direct millimeter-wave energy received at the top surface of the interposer to propagate away from the top surface of the interposer toward the bottom surface of the interposer via the waveguide structure. The interposer is configured to be physically coupled to the IC via the first set of contact pads corresponding to external contact pads of the IC package; and the interposer includes a second set of contact pads on a bottom surface of the interposer that is opposite the top surface of the interposer.

In another example embodiment, a method includes bonding an IC to a first set of contact pads on an interposer configured to be coupled to contact pads of the IC. The interposer includes a top surface having the first set of contact pads; a bottom surface having a second set of contact pads configured to be coupled to another circuit board; a waveguide structure formed integrally within the interposer device between the top surface and the bottom surface; and a transition structure configured to couple millimeter-wave energy received via one or more of the contact pads on the top surface into the waveguide structure. The transition structure is configured to direct millimeter-wave energy received at the top surface of the interposer to propagate away from the top surface through the waveguide structure and toward the bottom surface of the interposer.

BRIEF DESCRIPTION OF THE DRAWINGS

The present disclosure is illustrated by way of examples, embodiments and the like and is not limited by the accompanying figures, where like reference numbers indicate similar elements in the figures and throughout the detailed description of the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
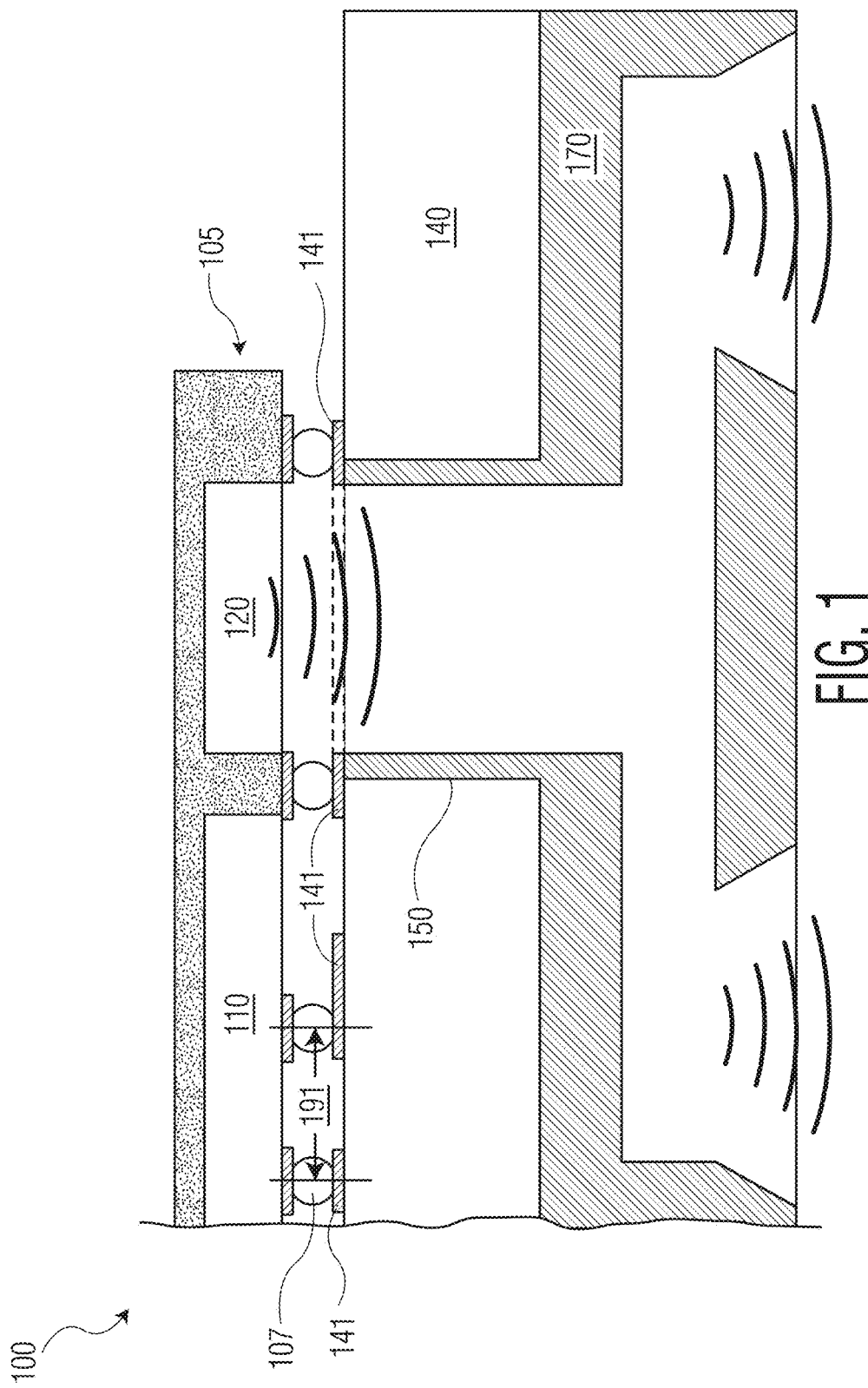
FIG. 1 is a cross-sectional illustration of an electronic device package that includes a millimeter-wave transmitter and a launcher that is coupled to a printed circuit board having an integrated wave guide.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are nonlimiting examples of suitable processes according to embodiments and are for the purposes of illustration. Systems and devices according to embodiments herein may be use any suitable processes including those that omit steps described above, perform those steps and similar steps in different orders, and the like. It will also be appreciated that well-known features may be omitted for clarity.

Unless explicitly stated otherwise, the use of terms "approximately," "substantially" and similar terms in connection with dimensions, relative positioning, or orientation of various features indicates that the dimensions, positioning, or orientation of those features are subject to tolerances and/or expected process variations of equipment and processes chosen to form the described features. Unless explicitly stated otherwise, the use of terms "approximately," "substantially" and similar terms in connection measurable values or characteristics is subject to the expected measurement accuracy of equipment and methods used to measure those values or characteristics and/or within tolerance limits specified by technical standards applicable to the technologies described.

Miniaturization of radiofrequency and microwave electronics for generating and receiving wireless signals present challenges because of the need for structures such as antennae to couple signals from packaged components (e.g., individual chips, systems on a chip, multichip packages, and the like) to free space. While it can be desirable to integrate such structures directly into a chip package, doing so tends to significantly increase the package size because the minimum dimensions of an antenna are often comparable or significantly larger than the effective wavelength of the signals being transmitted. Such direct integration can increase production costs and introduce undesirable geometric constraints on component placement within larger systems and devices. Some of these constraints are mitigated at higher frequencies such as the 30-300 GHz range ("millimeter waves", having free-space wavelengths between 1-10 mm) because the of the reduced size requirements of components such as antennae and waveguides in the millimeter-wave regime compared to lower frequency regimes (i.e., in the MHz range and lower). However, integration of millimeter-wave launchers and other structures can still significantly limit minimum package sizes relative to the size of individual integrated circuits, as illustrated by FIG. 1.

FIG. 1 is a cross-sectional view of an example system in one approach. The system 100 includes an integrated circuit package (the IC package 105) that contains a millimeter-wave integrated circuit (the IC 110) which is coupled to a millimeter-wave waveguide transition (a launcher 120) that allows millimeter-wave signals generated by the IC 110 to be coupled to an external antenna structure 170. The IC package 105 may be a ball-grid array (BGA) type package and is shown with solder bumps 107 bonding the IC package 105 to contacts 141 on a substrate 140 (which may be a modified printed circuit board, for example). The substrate 140 includes a waveguide section 150 that is coupled to the antenna section 170, thereby allowing millimeter wave signals generated by the IC 110 to be converted into wireless signals that propagate from the launcher 120 into the waveguide section 150 and finally into the antenna 170 which can radiate the signals into the surrounding environment. As shown, the walls of the waveguide section 150 are conductive (e.g., metallized) such that the waveguide section operates as a rectangular waveguide defined by electrically conductive walls with a center that can be filled with a dielectric material such as dielectric material of the substrate 140. Alternatively, the waveguide section 150 and similar structures described herein may be an air-filled, gas-filled, or evacuated cavities within a substrate such as the substrate 140.

It will be appreciated that integrating the launcher 120 into the IC package 105 means that the IC package 105 must be larger than both the launcher 120 and the IC 110 individually. Furthermore, integration of the launcher 120 into the IC package 105 introduces constraints on the placement of solder bumps (e.g., the solder bumps 107) or other structures used to couple the IC package 105 to the substrate 140 via the contacts 141. This is because the path between the launcher 120 and the waveguide section 150 cannot be obstructed by conductive material. Placement of the IC package 105 on the substrate 140 is also constrained because the launcher 120 must be positioned directly over the waveguide section 150 to allow radiated energy to be effectively coupled from the launcher 120 into the waveguide section 150). The solder bumps 107 (or other electrical interconnections between the IC package 105 and the substrate 140) may be arranged in order to maintain compatibility with conventional circuit board designs. For example, the solder bumps 107 (or other interconnections) may be spaced with a minimum spacing indicated by the dimension 191 and/or spaced with a regular pitch defined by the dimension 191.

Figure 2:
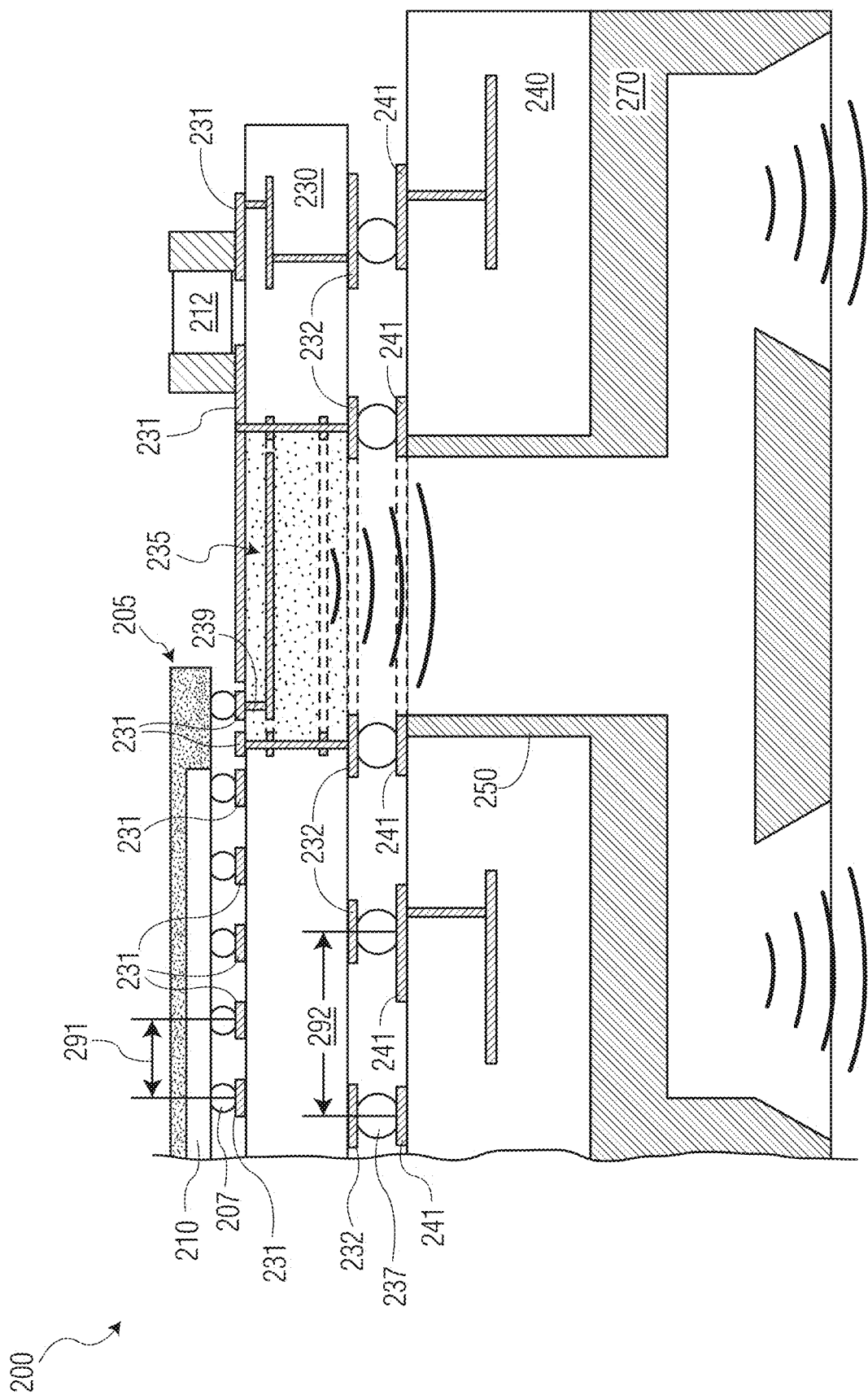
FIG. 2 is a cross-sectional illustration of an electronic device package and system according to one or more embodiments that includes a packaged mm-Wave device coupled to a printed circuit board interposer with an integrated millimeter wave launcher.

Accordingly, embodiments herein allow for reduced package sizes for ICs, such as the IC 110, and related components while facilitating integration with external antenna structures such as the antenna section 170 and the like. FIG. 2 shows an example system according to one or more embodiments herein.

The system 200 includes a package 205 and a substrate 240 (e.g., the substrate 140 as shown in FIG. 1) with a waveguide section 250 (e.g., the waveguide section 150 as shown in FIG. 1) coupled to an antenna section 270 (e.g., the antenna section 170 as shown in FIG. 1). The IC package 205 includes a millimeter-wave integrated circuit (an IC 210; e.g., the IC 110 as shown in FIG. 1) and is shown with solder bumps 207 bonding the IC package 205 to an interposer 230 which may be a printed circuit board (PCB) substrate or any other suitable substrate having the features described further below.

The interposer 230 has a first set of contacts 231 on its top side allowing components such as the IC 210 in the IC package 205 and other components such as the component 212 (represented as a discrete passive device such as an inductor or resistor, as a nonlimiting example) to be physically coupled to the interposer 230. As shown, the IC package 205 is coupled to the contacts 231 on the top surface of the interposer by solder bumps 207, and the component 212 is depicted as being surface-mounted to contacts 231 on the top surface of the interposer via solder reflow, or any other acceptable method, as nonlimiting examples. Components such as the IC package 205 and the component 212 may be electrically coupled as needed to contacts (e.g., contacts 241) on the substrate 240 via a second set of contacts 232 on the bottom of the interposer 230 that are in turn coupled to the substrate 240 (e.g., via solder bumps 237, as shown or by any other suitable method). The contacts 231 on the top side of the interposer 230 can be connected as needed to the contacts 232 on the bottom side in order to enable electrical connections between components such as the IC package 210 and the component 212 on the top surface of the interposer 230.

The interposer 230 includes a transition structure (a launcher 235) which can function similarly to the launcher 120 of FIG. 1, with one difference being that the launcher 235 is disposed within the interposer 230 rather than within the IC package 205. As shown, millimeter-wave signals can be coupled from the IC 210 to the launcher 235 via a feed contact 239 coupled to one of the solder ball connections 207. It will be understood that the IC 210 within the IC package 205 is shown directly connected to the feed contact 239 via a solder bump connection (one of the solder bumps 207) for purposes of illustration, but that any suitable connection method may be used. For example, the IC package 205 may be positioned away from the launcher 235 and coupled to the feed contact 239 via a conductive trace on or within the interposer 230. It will be further understood that nothing herein is intended to require the use solder bump connections. Rather, any suitable structures and methods can be used including solder reflow, conductive adhesives, and the like as nonlimiting examples.

It will be understood that the configuration of components in systems and devices such as the system 200 including an interposer such as the interposer 230 can confer various advantages. As one example, interposers according to one or more embodiments can have arrangements of contacts that are not typically supported by conventional chip assembly processes, while retaining compatibility with conventional circuit board layouts via compatible contacts on the bottom of the interposer (e.g., the solder bumps 237 of FIG. 2). For example, the solder bumps 207 may have a spacing defined by the dimension 291 which may be smaller than supported by conventional printed circuit board assembly processes. Meanwhile, the solder bumps 237 on the opposite side of the interposer 230 may have a spacing defined by the dimension 292 that may maintain compatibility with conventional assembly processes. As a result, chip packages such as the IC package 205 can be made more compact while still being compatible with conventional printed circuit board layouts and/or conventional design rules when the interposer 230 is bonded to a circuit board or other substrate such as the substrate 240 as pictured. Similarly, the solder bumps 207 or other contacts on interposers such as the interposer 230 may be smaller than conventional solder bumps or other contacts while the solder bump 237 or other contacts on such interposers may be conventionally-sized.

Another potential advantage of the use of interposers such as the interposer 230 is the ability to place such packages containing millimeter-wave components such as the—IC 210 remotely, away from structures such as the launcher 235 or the waveguide section 250, allowing for greater flexibility in the design of larger systems built on printed circuit boards or similar substrates such as the substrate 240.

Figure 3:
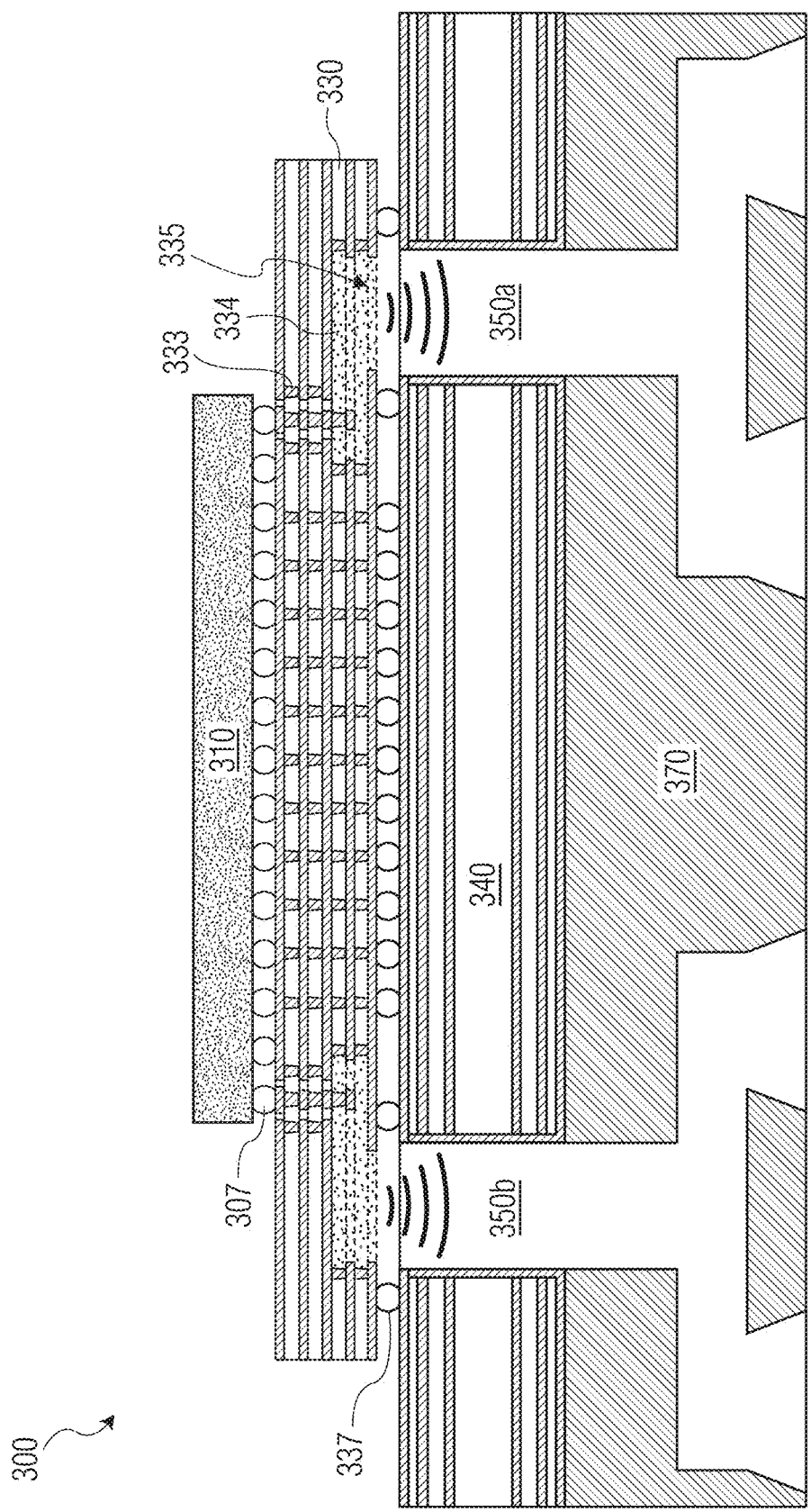
FIG. 3 is a cross-sectional illustration of an electronic device package and system according to one or more embodiments that includes a packaged millimeter-wave device coupled to a printed circuit board interposer that couples millimeter-wave signals from the device to a waveguide via an integrated transition from a ball grid array contact to a horizontal waveguide in the interposer via coaxial transition structure.

FIG. 3 shows a cross-sectional view of another example system featuring another interposer according to one or more embodiments. The system 300 includes a millimeter-wave IC 310 (which may be part of an IC package such as the IC package 205 as shown in FIG. 2), configured to be coupled to an interposer 330, which is in turn configured to be coupled to a substrate 340 (e.g., a substrate 140 as shown in FIG. 1 or a substrate 240 as shown in FIG. 2) that includes an antenna structure 370, which includes two antenna arms fed by the waveguide sections 350a, 350b. The system 300 includes solder bumps 307 and 337.

The interposer 330 also includes additional structures that allow for greater flexibility in delivering millimeter wave signals from integrated circuits such as the IC 310 which are discussed further below in connection with FIG. 3 and in further detail with connection to FIG. 4A and FIG. 4B. Specifically, the interposer 330 includes a coaxial transmission structure (a coaxial transition 333) and a waveguide structure (a waveguide transition 334). The coaxial transition 333 is configured to receive millimeter wave signals from the IC 310 and propagate them in a coaxial mode along a conductive feature that functions as a center conductor that is surrounded by electrically conductive material. The coaxial transition 333 is in turn coupled to a waveguide structure (the waveguide transition 334) within the interposer 330. The waveguide transition 334 includes an aperture 335 which can be aligned as shown to propagate millimeter-wave energy received from the IC 310 via the coaxial transition 333 to another waveguide, such as the waveguide section 350a within the substrate 340 in the example of FIG. 3.

FIG. 3 shows a single interposer 330 with a single IC 310 and a substrate 340 with two waveguide sections 350a, 350b for purposes of illustration. It will be understood that nothing herein is intended to limit embodiments only a single integrated circuit on an interposer, to only one interposer on a substrate, or to any specific number of transition structures (e.g., the transitions 333, 334) or to any number of waveguide sections. For example, multiple interposers may be coupled to a substrate and each interposer may include one or more components on its surface. A component such as an IC 210, 310 of FIGS. 2, 3, respectively, may be coupled to one or more antennae, waveguides, or other structures and multiple components such as an IC 210, 310 of FIGS. 2, 3, respectively may be connected independently or interconnected in any suitable configuration.

Figure 4A:
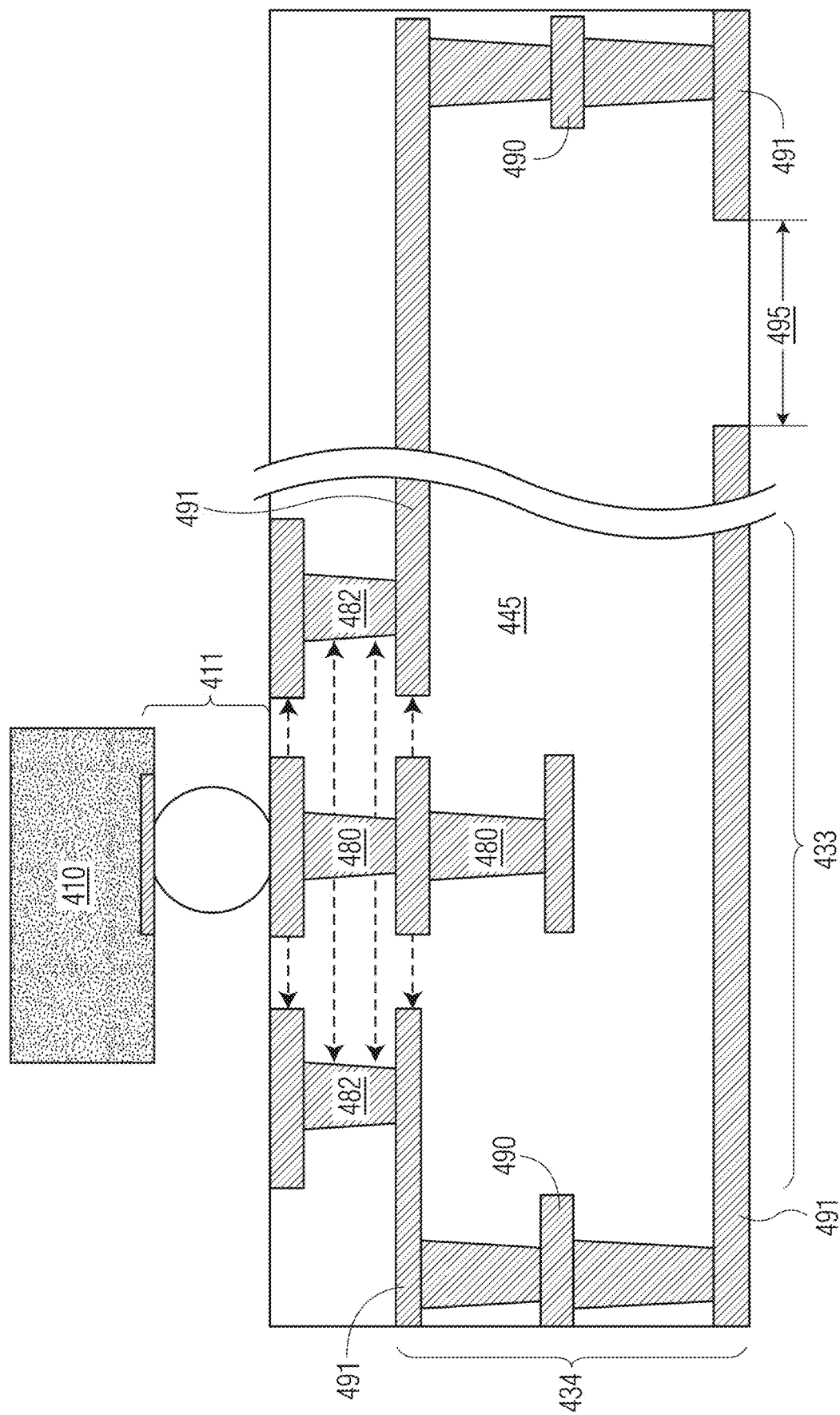
FIG. 4A is a cross-sectional illustration showing elements of a ball-grid-array to horizontal waveguide transition that includes a coaxial transition element according to one or more embodiments.

FIG. 4A is a cross-section view of a junction between a coaxial transition 433 (e.g., the coaxial transition 333 as shown in FIG. 3) and a waveguide transition 434 (e.g., the waveguide transition 334 as shown in FIG. 3) in further detail. As shown, the coaxial transition 433 is formed by a set of vias extending to first depth within in a dielectric material 445 (e.g., printed circuit board material or any other suitable dielectric material) that surround a via 480 that extends to a second depth in the dielectric material 445. As shown, the via 480 penetrates (e.g., extends into) a waveguide transition 434 that extends from the first depth in the dielectric material 445 to a third depth at a first end of the waveguide transition 434. The waveguide transition 434 is a waveguide formed by vertically-oriented conductive sidewalls 490 and horizontally-oriented conductive sidewalls 491 that define a volume in which wireless signals coupled to the waveguide propagate. The waveguide may be a dielectric-filled waveguide, as shown, or a hollow waveguide that is evacuated or gas-filled.

An aperture 495 at a second end of the waveguide transition 434 allows for millimeter-wave energy radiated from the coaxial transition 433 into the waveguide transition 434 to propagate through the aperture 495 to another waveguide structure (e.g., a waveguide section 350a/350b as shown in FIG. 3). A millimeter-wave integrated circuit such as the IC 410 may couple millimeter-wave signals to the coaxial transition 433 via a feed contact structure 411 that electrically couples an internal signal line to the via 480 of the coaxial transition 433. The feed contact structure may include a solder bump (e.g., one of the solder bumps 307 as shown in FIG. 3) as shown or any other suitable conductive connection.

It will be appreciated that, in one or more embodiments, various conductive elements forming a coaxial transition such as the coaxial transition 433 and a waveguide transition such as the waveguide transition 434, are formed using conventional techniques for forming pads and vias in multilayer printed circuit boards and similar substrates. It will be further appreciated that, in one or more embodiments, conductive walls such as the conductive walls 490, 491 need not be continuous for the transitions to function as described; rather, an array of electrically isolated vias or similar structures may behave as a conductive wall when the spacing between such structures approaches the wavelength of the radiated energy being propagated and the individual structures are electrically coupled to each (e.g., by a conductive pad on a surface of the interposer as illustrated in FIG. 4B). For instance, if the wavelength of the radiating energy when propagating in a dielectric material such as the dielectric material 445 is 10 mm, then isolated vias spaced apart from each other with spacings on the order of 1 mm may function equivalently to a solid conductive surface at the corresponding signal frequency and when the vias are electrically short-circuited to each other (e.g., at the top surface of the interposer or a any other convenient locations). As an example, to one approximation, spacings of approximately one-eighth the wavelength are sufficient for electrically coupled elements to behave similarly to a single solid conductor.

Figure 4B:
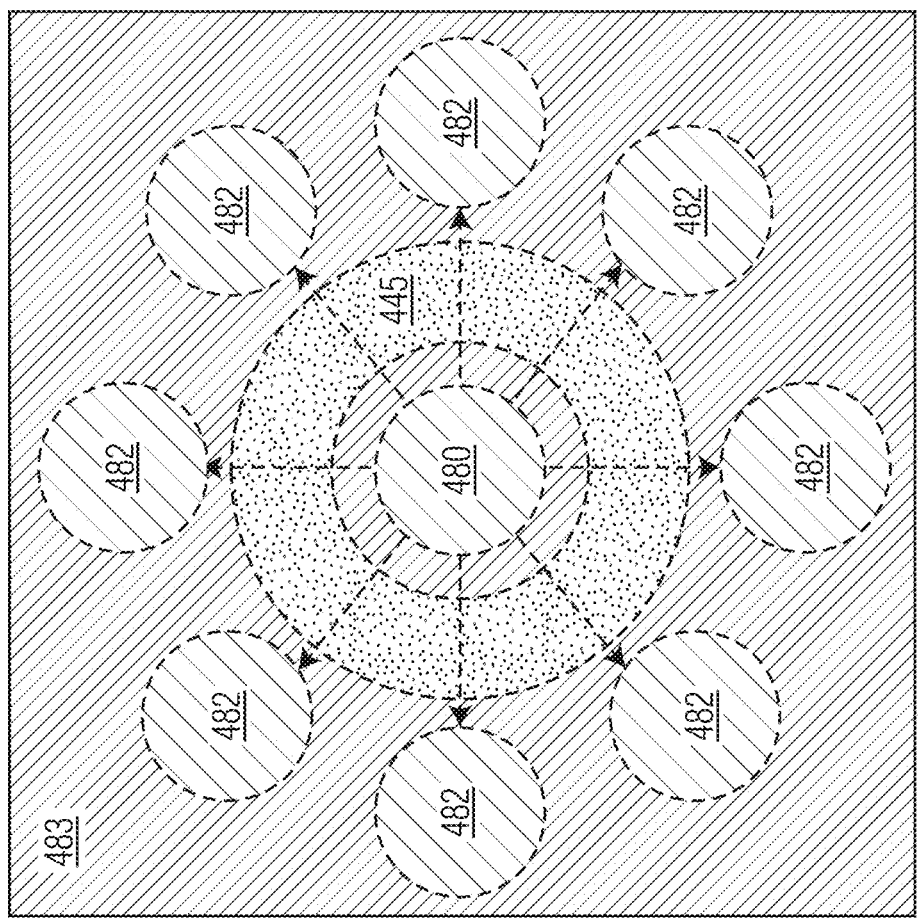
FIG. 4B is a top plan view of the circuit board of FIG. 4A.

Along these lines, FIG. 4B shows a top plan view of the coaxial transition 433 of FIG. 4A in which the central via 480 acts as a center conductor and is surrounded by vias 482 (also shown in FIG. 4A). As shown, the vias 482 may be short-circuited to a conductive pad 483 on the surface of a dielectric material such as the dielectric material 445 (e.g., on the top surface of the top surface of the interposer).

It will be appreciated that, although single-ended transmission configuration may be described in connection with examples herein, nothing is intended to limit embodiments to such a single-ended signal transmission configuration. Rather, it will be understood that in one or more embodiments, additional contacts are present enabling a differential signal transmission configuration.

Figure 5B:
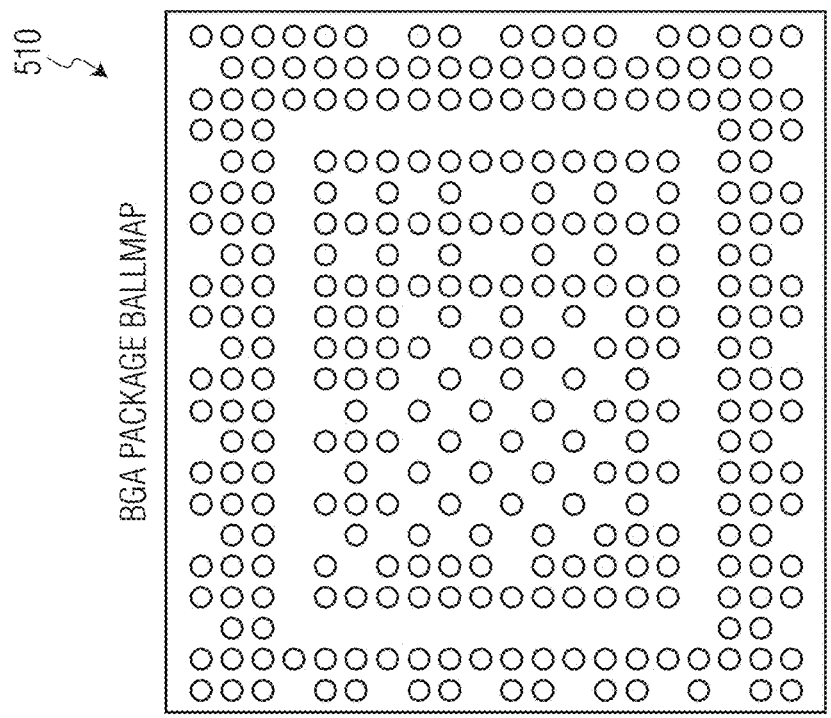
FIG. 5B is a top plan view of an interposer corresponding to the BGA pattern of FIG. 5A according to one or more embodiments.
Figure 5A:
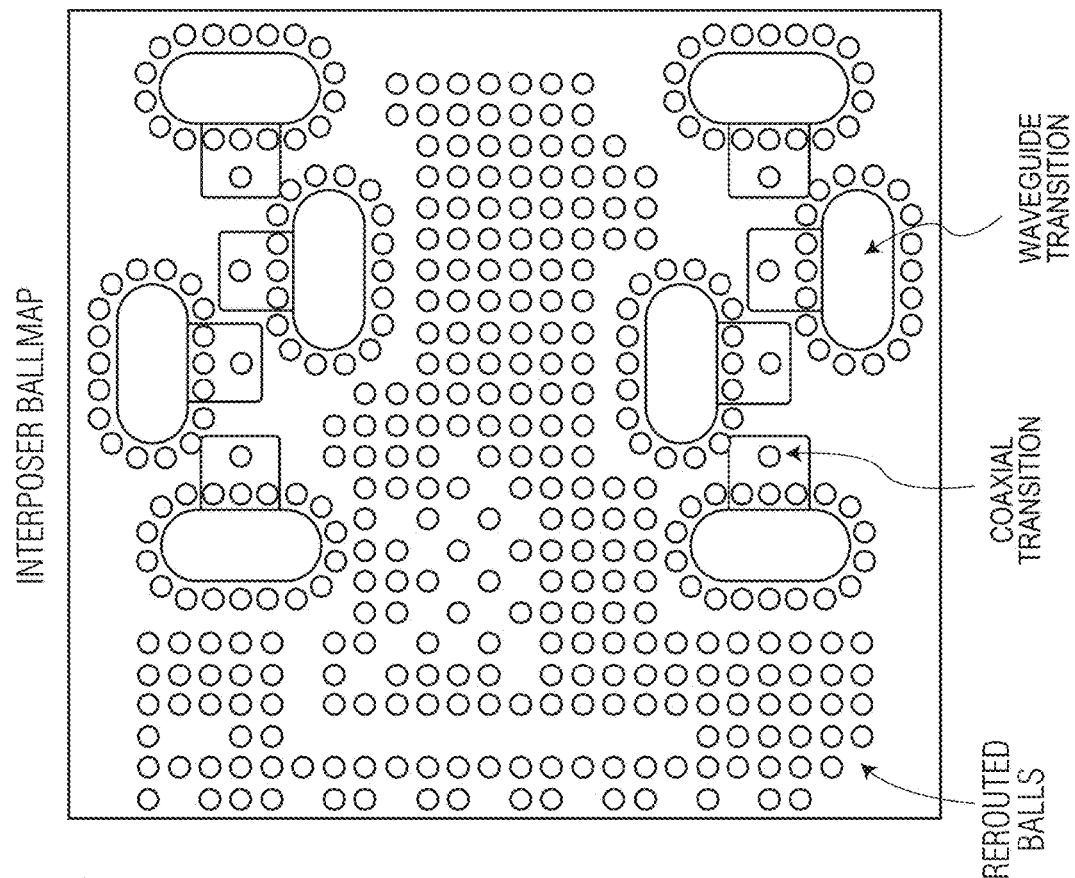
FIG. 5A is a bottom plan view of an example device package according to one or more embodiments showing a pattern of ball grid array (BGA) contacts.

FIG. 5A is a plan view of an interposer 530 such as the interposer 330 of FIG. 3 according to one or more embodiments. The illustrated plan view may represent an interposer ballmap, including rerouted balls, a coaxial transition, and a waveguide transition. As shown in FIG. 5A, interposers according to embodiments herein may have top surfaces with contact areas that deviate from a conventional rectangular array in order to accommodate additional features such as coaxial transitions, integrated waveguide structures, and the like while maintaining a regular arrangement of contact pads on their bottom surfaces in order to be easily coupled to a circuit board of other substrate with a conventional arrangement of contact pads.

Accordingly, as shown in the plan view of FIG. 5B, a millimeter-wave integrated circuit in an IC package 510 such as the IC package 305 of FIG. 3 may be encapsulated in a chip package with a modified pattern of solder balls or other suitable interconnections to mate to an interposer with a modified contact arrangement such as the one shown in FIG. 5A. The illustrated plan view may represent a BGA package ballmap.

It will be appreciated that ICs and IC packages coupled to interposers according to embodiments herein (e.g., the IC package 205 as shown in FIG. 2 on the interposer 230 as shown in FIG. 2 or the IC 310 as shown in FIG. 3 on the interposer 330 as shown in FIG. 3) can be over molded or otherwise encapsulated to produce a package with an integrated launcher (e.g., as an alternative to the package 105 as shown in FIG. 1). It will be further appreciated that such packages or ICs can be molded or encapsulated in-place after being coupled to another circuit board or other substrate. Such encapsulated structures may also be shielded by enclosing or otherwise surrounded them in suitably conductive material. Thus, in one or more embodiments, an IC coupled to an interposer is encapsulated in polymeric material. In one or more embodiments, such an IC is surrounded by a conductive structure that shields the IC from receiving or generating wireless signal interference.

VARIOUS EXAMPLES

Features of embodiments may be understood by way of one or more of the following examples:

Example 1: a system, device, or method for an interposer circuit board ("interposer") that includes a top surface, a bottom surface, a waveguide structure, and a transition structure. The top surface of the interposer has a first set of contact pads configured to be coupled to contacts of an integrated circuit ("IC") and the bottom surface of the interposer has a second set of contact pads configured to be coupled to another circuit board. The transition structure is configured to couple millimeter-wave energy received via one or more of the contacts on the top surface of the interposer into the waveguide structure. The transition structure is configured to direct millimeter-wave energy received at a top surface to propagate away from the top surface through the waveguide structure and toward the bottom surface of the interposer.

Example 2: the system, device, or method of Example 1 that further includes an integrated circuit (IC) disposed within an IC package. The interposer is configured to be physically coupled to the IC via the first set of contact pads corresponding to external contacts of the IC package.

Example 3: the system, device, or method of Example 1 or Example 2, in which the second set of contact pads conform to a first contact pitch specification; and the first set of contacts includes contacts characterized by a pitch that is smaller than a minimum contact pitch defined by the first contact pitch specification.

Example 4: the system, device, or method of any of Examples 1-3, where the second set of contact pads conform to a first contact pitch specification; and the first set of contacts include contacts characterized by a diameter that is smaller than a minimum contact diameter of the first contact specification.

Example 5: the system, device, or method of any of Examples 1-4, where the waveguide structure includes electrically conductive walls disposed within the interposer between the top surface of the interposer and the bottom surface of the interposer; and the electrically conductive walls define a volume in which wireless signals propagate through the waveguide structure. This Example also includes a radiating structure ("launcher") that is coupled to a feed contact on the top surface of the interposer and that is disposed within the cavity. The launcher structure is configured to radiate millimeter-wave energy corresponding to a signal received at the feed contact into the waveguide structure.

Example 6: the system, device, or method of any of Examples 1-5, where the transition structure includes a launcher structure integrally formed within the interposer and configured to radiate energy received from the IC away from the interposer.

Example 7: the system, device, or method of any of Examples 1-6, where the interposer is physically coupled to the IC and the IC is electrically coupled to the transition structure via the first set of contacts.

Example 8: the system, device, or method of any of Examples 1-7, further including one or more additional electronic components that are bonded to contacts belonging to the first set of contact pads.

Example 9: the system, device, or method of any of Examples 1-8, where the interposer is bonded, via the second set of contact pads, to a third set of contact pads on another circuit board that includes a waveguide; and the printed circuit board and the interposer are jointly configured and arranged to propagate millimeter-wave radiation from the bottom of the interposer into the waveguide structure.

Example 10: the system, device, or method of any of Examples 1-9, where the transition structure is configured to direct the millimeter-wave energy received at the top surface of the interposer to propagate along a vertical axis from the top surface of the interposer to the bottom surface of the interposer.

Example 11: the system, device, or method of any of Examples 1-10, further including bonding integrated circuit to the first set of contact pads on the interposer.

Example 12: the system, device, or method of any of Examples 1-11, further including bonding the interposer to an additional circuit board via the second set of contact pads where the additional circuit board includes an additional waveguide structure. When the interposer and circuit board are bonded together, they are jointly configured and arranged to couple wireless signals between the IC and the additional waveguide structure via the transition structure and the waveguide structure of the interposer.

Example 13: the system, device, or method of any of Examples 1-12, further including aligning the aperture of the waveguide structure of the interposer above the additional waveguide structure such that wireless signals can propagate between the waveguide structure of the interposer and the additional waveguide structure.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no Intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A system comprising:
an integrated circuit (IC) disposed within an IC package;
an interposer circuit board ("interposer") that includes a transition structure configured to couple millimeter-wave energy received from the integrated circuit via a first set of contact pads on a top surface of the interposer into a waveguide structure integrally formed within a volume of the interposer between the top surface of the interposer and a bottom surface of the interposer;
wherein the transition structure is configured to direct millimeter-wave energy received at the top surface of the interposer to propagate away from the top surface of the interposer toward the bottom surface of the interposer via the waveguide structure;
wherein the interposer is configured to be physically coupled to the IC via the first set of contact pads corresponding to external contact pads of the IC package;
wherein the interposer includes a second set of contact pads on a bottom surface of the interposer that is opposite the top surface of the interposer;
wherein the first set of contact pads includes first contact pads that are spaced apart by a first pitch; and
wherein the second set of contact pads includes second contact pads that are spaced apart by a second pitch that is greater than the first pitch.

2. The system of claim 1, wherein the transition structure is configured to direct the millimeter-wave energy received at the top surface of the interposer to propagate along a vertical axis from the top surface of the interposer to the bottom surface of the interposer.

3. The system of claim 1,
wherein the first contact pads of the first set of contact pads are smaller in diameter than second contact pads of the second set of contact pads.

4. The system of claim 1, wherein the waveguide structure includes:
electrically conductive walls disposed within the interposer between the top surface of the interposer and the bottom surface of the interposer, wherein the electrically conductive walls define a volume in which wireless signals propagate through the waveguide structure, wherein the transition structure comprises a launcher structure that is coupled to a feed contact on the top surface of the interposer and that is disposed within the cavity, wherein the launcher structure is configured to radiate millimeter-wave energy corresponding to a signal received at the feed contact into the waveguide structure.

5. The system of claim 1, wherein the transition structure includes a launcher structure integrally formed within the interposer and configured to radiate energy received from the IC away from the interposer.

6. The system of claim 1, wherein the interposer is physically coupled IC and the IC is electrically coupled to the transition structure via the first set of contact pads.

7. The system of claim 1, further comprising one or more additional electronic components that are bonded to contact pads belonging to the first set of contact pads.

8. The system of claim 1,
wherein the interposer is bonded, via the second set of contact pads, to a third set of contact pads on a circuit board that includes a waveguide; and
wherein the circuit board and the interposer are jointly configured and arranged to propagate millimeter-wave radiation from the bottom of the interposer into the waveguide structure.

9. An interposer circuit board ("interposer") comprising:
a top surface having a first set of contact pads configured to be coupled to contact pads of an integrated circuit ("IC");
a bottom surface having a second set of contact pads configured to be coupled to a circuit board;
a waveguide structure formed integrally within the interposer between the top surface of the interposer and the bottom surface of the interposer;
a transition structure configured to couple millimeter-wave energy received via one or more of the contact pads on the top surface into the waveguide structure; and
one or more additional electronic components that are bonded to first contact pads belonging to the first set of contact pads;
wherein the transition structure is configured to direct millimeter-wave energy received at the top surface of the interposer to propagate away from the top surface through the waveguide structure and toward the bottom surface of the interposer.

10. The interposer of claim 9, wherein the transition structure is configured to direct the millimeter-wave energy received at the top surface of the interposer to propagate along a vertical axis from the top surface of the interposer to the bottom surface of the interposer.

11. The interposer of claim 9,
wherein second set of contact pads conform to a first contact pitch specification;
wherein the first contact pads of the first set of contact pads are characterized by:
a pitch that is smaller than a minimum contact pitch defined by the first contact pitch specification; or
a first diameter that is smaller than a second diameter of second contact pads of the second set of contact pads.

12. The interposer of claim 9, wherein the waveguide structure includes:
electrically conductive walls disposed within the interposer between the top surface of the interposer and the bottom surface of the interposer, wherein the electrically conductive walls define a volume in which wireless signals coupled to the waveguide structure propagate through the waveguide structure, wherein the transition structure comprises a launcher structure that is coupled to a feed contact on the top surface of the interposer and that is disposed within the waveguide stricture, wherein the launcher structure is configured to radiate millimeter-wave energy corresponding to a signal received at the feed contact into the waveguide structure.

13. The interposer of claim 9, wherein the transition structure includes a launcher structure integrally formed within the interposer and configured to radiate energy received via one or more of the first set of contact pads away from the interposer.

14. A method comprising:
bonding an integrated circuit to a first set of contact pads on an interposer circuit board ("interposer") configured to be coupled to contact pads of the integrated circuit ("IC");

wherein the interposer comprises:
  a top surface having the first set of contact pads;
  a bottom surface having a second set of contact pads configured to be coupled to a first circuit board;
  a waveguide structure formed integrally within the interposer device between the top surface and the bottom surface; and
  a transition structure configured to couple millimeter-wave energy received via one or more of the contact pads on the top surface into the waveguide structure;
wherein the transition structure is configured to direct millimeter-wave energy received at the top surface to propagate away from the top surface through the waveguide structure and toward the bottom surface of the interposer;
wherein the first set of contact pads includes first contact pads that are spaced apart by a first pitch; and
wherein the second set of contact pads includes second contact pads that are spaced apart by a second pitch that is greater than the first pitch.

15. The method of claim 14, further comprising
bonding the interposer to a second circuit board via the second set of contact pads;
wherein the second circuit board comprises an additional waveguide structure; and
wherein, when the interposer and the second circuit board are bonded together, the interposer and the second circuit board are jointly configured and arranged to couple wireless signals between the IC and the additional waveguide structure via the transition structure and the waveguide structure of the interposer.

16. The method of claim 15, further comprising
aligning an aperture of the waveguide structure of the interposer above the additional waveguide structure such that the wireless signals can propagate between the waveguide structure of the interposer and the additional waveguide structure.

* * * * *